United States Patent [19]

Chang et al.

[11] Patent Number: 5,773,360

[45] Date of Patent: Jun. 30, 1998

[54] REDUCTION OF SURFACE CONTAMINATION IN POST-CMP CLEANING

[75] Inventors: Chung-Long Chang, Dou-Liu; Chen-Hua Yu; Syun-Ming Jang, both of Hsin-Chu, all of Taiwan

[73] Assignee: Taiwan Semiconductor Manufacturing Company, Ltd., Hsin-Chu, Taiwan

[21] Appl. No.: 734,067

[22] Filed: Oct. 18, 1996

[51] Int. Cl.⁶ .................................................. H01L 21/461
[52] U.S. Cl. ...................... 438/626; 438/723; 438/959; 438/691; 438/692; 438/690; 438/906
[58] Field of Search ........................... 438/626, 691, 438/710, 723, 734, 743, 959, 906, 692, 690

[56] References Cited

U.S. PATENT DOCUMENTS

| | | |
|---|---|---|
| 5,371,047 | 12/1994 | Greco et al. . |
| 5,389,194 | 2/1995 | Rostoker et al. ................. 156/636 |
| 5,399,234 | 3/1995 | Yu et al. ............................ 156/636 |
| 5,478,436 | 12/1995 | Winebarger et al. . |
| 5,663,102 | 9/1997 | Park ................................... 438/626 |

OTHER PUBLICATIONS

Davarik, B., et al. "A new planarization technique, using a combination of RIE and CMP", International Electron Devices Meeting 1989 pp. 61–64 (abstract only).
Wolf, S., et al "Silicon Processing for the VLSI Era vol. 1" Lattice Press, Calif. pp. 569–571, 1986.

*Primary Examiner*—Caridad Everhart
*Attorney, Agent, or Firm*—George O. Saile; Stephen B. Ackerman

[57] ABSTRACT

Chemical-mechanical polishing is followed with a scrubbing procedure for the removal of any particulate contaminants. Scrubbing is succeeded by a plasma etching step, using a parallel electrode plasma etcher, a downstream plasma etcher, or similar apparatus. Plasma etching is performed for about 30 seconds using $CF_4$ as the etching gas, so that about 300 Angstroms of the post CMP surface is removed. This results in the almost total elimination of residual mobile ions from the polished surface without the introduction of microgrooves and similar blemishes as is often the case when HF is used for this purpose.

15 Claims, 2 Drawing Sheets

REDUCTION OF SURFACE CONTAMINATION IN POST-CMP CLEANING

BACKGROUND OF THE INVENTION (1) Field of the Invention

The invention relates to the field of Chemical-Mechanical Polishing, more particularly to ways to remove contaminants that remain after completion of the process.

(2) Description of the Prior Art

In integrated circuit technology, the removal of various layers is usually accomplished through use of liquid or gaseous etchants. In these cases, the reaction products are fluids that are readily removed from the reaction site so that etching can proceed at a uniform rate. In certain cases, however, the reaction products are insoluble solids that are, at best, hard to remove. At worst, such etchants serve only to undermine, or weaken, the layer's integrity near the surface and, in the absence of any other action, are thus quite ineffective as etchants.

In etching situations of this sort, mechanical assistance in the form of a slurry comprising an abrasive powder suspended in a suitable liquid medium (such as the etchant itself) can be used to complement the action of the chemical etchant. This technique for removing material through a combination of chemical and mechanical means is referred to as Chemical Mechanical (chem.-mech.) Polishing (CMP).

CMP also makes possible the controlled removal of material along a planar etch front, unlike pure fluid etches where the etch front tends to follow the contours of the original surface. CMP is therefore widely used for the planarization of integrated circuits. A disadvantage of CMP is that at the completion of a CMP operation some of the slurry tends to get left behind on the freshly polished surface. In addition, contamination of the surface by mobile ions, such as potassium, can occur. This is a particular problem when silicon oxides of one sort or another are being removed, as the preferred etchant in such cases is potassium hydroxide (while the slurry is usually made up of aluminum oxide particles).

One method for removing the slurry particles is scrubbing with polyvinyl bromide brushes, usually of both surfaces of the silicon wafer simultaneously. While this is generally effective for removing the particulate contaminants it has no effect on mobile ions that have been left behind after CMP. In the commercial process marketed by OnTrak Systems Inc. ammonium hydroxide is added during scrubbing but its effectiveness in removing such mobile ions is quite limited (see Table I later).

This problem of contamination by mobile ions, particularly of silicon oxide by potassium ions, has been dealt with in the prior art by etching away a thin layer of the freshly polished surface using a fluoride bearing etchant such as hydrogen fluoride (HF). For example, Rostoker et al. (U.S. Pat. No. 5,389,194 Feb. 1995) remove alumina particles by etching in phosphoric acid and, optionally, include a small amount of HF so that the silicon oxide surface is also lightly etched.

Winebarger et al. (U.S. Pat. No. 5,478,436 Dec. 1995) use a cleaning solution that includes an organic solvent and fluoride ions in order to remove mobile metal ions left behind after CMP. The most common mix was ethylene glycol and ammonium fluoride. A quite different approach to removing mobile ions after CMP is described by Yu et al. (U.S. Pat. No. 5,399,234 Mar 1995). An acoustic wave is passed through the slurry during polishing. The primary purpose is to better define the end point for polishing but the cleanliness of the final surface is said to also be improved. No data is provided as to the residual concentration of mobile ions at the end of their process, even though potassium hydroxide was the etchant used.

The use of HF to remove residual mobile ion contaminants has proven to be quite effective (see Table I later). As we will discuss below, this approach to the problem introduces certain undesirable side effects which the present invention teaches how to overcome.

SUMMARY OF THE INVENTION

It has been an object of the present invention to provide a process for chem-mech. polishing, including post polish treatment, which results in a surface that is microscopically smooth and free of residual mobile ions.

A further object of the present invention has been that said process also provide a surface that is free of particulate contaminants.

Yet another object of the present invention has been to provide a process that achieves the foregoing results without adding significantly to the cost of the process.

These objects have been achieved by following the CMP process with a scrubbing procedure for the removal of any particulate contaminants. Scrubbing is succeeded by a plasma etching step, using a parallel electrode plasma etcher, a downstream plasma etcher, or similar apparatus. Plasma etching is performed for about 0.5 minutes using carbon tetrafluoride as the etching gas, so that about 300 Angstroms of the post CMP surface is removed. This results in the almost total elimination of residual mobile ions from the surface without the introduction of microgrooves and similar blemishes into the polished surface.

DESCRIPTION OF THE PREFERRED EMBODIMENTS

As already mentioned, etching for a short time in HF has proven to be effective in removing mobile ion contaminants, such as potassium, from surfaces that have undergone CMP (followed by scrubbing to remove the particulate contaminants). It is, however, not well known that this HF etching step may introduce a new set of problems, namely the appearance of grooves, trenches, etc. in the surface that has been etched by the HF.

The fact that fluoride etches can introduce surface irregularities in a surface that, prior to etching, appeared to be perfectly smooth has been observed before. It is possible for material near the surface to appear to be perfectly normal when it is in fact weak, damaged, or otherwise dislocated. In fact, before silicon crystals could be grown to levels of near perfect structural regularity, dislocations of the crystal lattice were frequently visualized in the form of etch pits on the surface. As already discussed, CMP depends for its action on first weakening the surface and then removing the weakened parts mechanically. This then explains why the HF was found to generate undesirable surface blemishes such as grooves and trenches. It should, however, be noted that although this phenomenon is understood, it has not been previously reported as a side-effect of CMP since there would normally be no reason to examine the surface after mobile ion removal.

Figure 1:
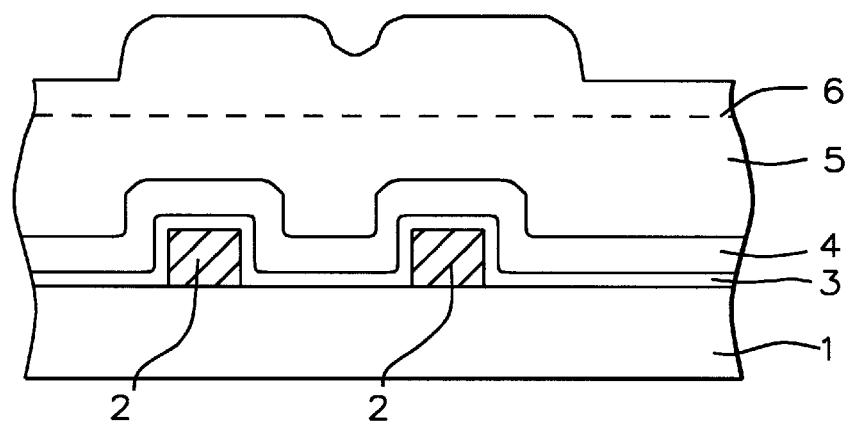
FIG. 1 shows a cross-section of a silicon integrated circuit including wiring and passivation layers.

Referring now to FIG. 1, semiconductor substrate 1 (usually silicon) is schematically shown with with two examples of conductive wiring 2 (running at right angles to the plane of the figure). Not shown, but assumed to be present, are various active devices previously formed in the silicon and contacted and connected by said wiring. A thin silicon oxide layer 3 derived from Plasma Enhanced Tetra-Ethyl-Ortho-Silicate (PETEOS) covers wiring 2 and is itself covered by oxide layer 4 derived from ozone TEOS ($O_3$ TEOS). Finally, passivating layer 5, derived from PETEOS or Boro-Phospho TEOS (BPTEOS), covers the entire wafer to a thickness between about 9,000 and 25,000 Angstroms. As can be seen, the upper surface of layer 5 follows the approximate contours of layer 3 and needs to be planarized before additional layers are deposited. The intent is to remove material from layer 5 until its upper surface coincides with dotted line 6.

Figure 2:
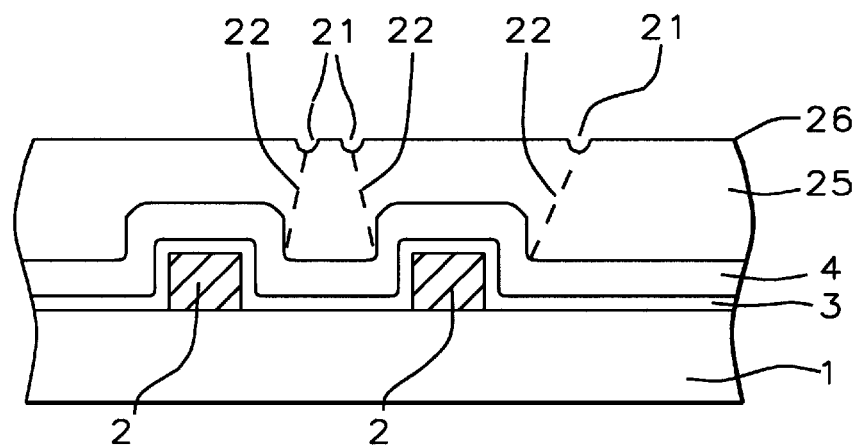
FIG. 2 shows the integrated circuit of FIG. 1 after CMP that has been followed by HF etching for removal of residual ions.

After the completion of CMP (performed with alumina particles suspended in a potassium hydroxide or ammonium hydroxide solution and resulting in the removal of between about 5,000 and 15,000 Angstroms of material) the polished surface is scrubbed using polyvinyl bromide to remove the particulate contamination. Optionally, ammonium hydroxide may be added along with the scrubbing). Following our previous practice, scrubbing would be followed by a short rinse in HF for the purpose of removing residual mobile ions, particularly potassium. The amount of polished layer 5 removed by the HF was in the range of from about 50 to 500 Angstroms. Microscopic examination by us of the morphology of layer 5, after HF treatment, revealed the presence of microgrooves and trenches. This is illustrated schematically in FIG. 2. Layer 25 represents the original layer 5 after CMP and HF etching. As a result of the latter, microgrooves, such as 21, have now appeared in the newly formed surface 26 where internal stress lines 22 meet the surface.

Figure 3:
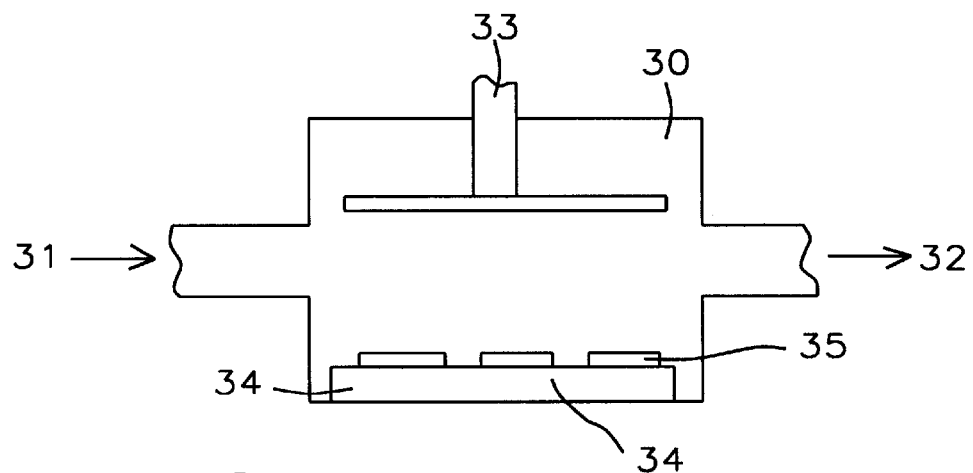
FIG. 3 shows a parallel electrode plasma etcher.

Although it was clear that the HF treatment was undesirable, the problem of removing the residual mobile ions still remained. Referring now to FIG. 3, we show a parallel electrode plasma etcher. Reactive gas 31 enters etch chamber 30 and passes through it on its way to vacuum sink 32. Radio Frequency (RF) electrode 33 is connected to an appropriate RF circuit (not shown) while substrate holder 34, on which semiconductor wafers 35 rest, is at ground potential and forms part of the RF circuit. As gas 31 enters the RF field it becomes dissociated and/or ionized, substantially increasing its reactivity relative to silicon oxide and therefore acting as an effective etchant.

Typically, the time period for which the wafers were subjected to plasma etching was between about 0.2 and 5 minutes. For the reactive gas we have used $CF_4$ but similar gases such as $CHF_3$ or $SF_6$ could also have been used. We have found that removing between about 50 and 500 Angstroms of the polished surface (after scrubbing) in this manner effectively removes the residual mobile ions (see Table I below) without, at the same time, introducing microgrooves or trenches in the polished surface. This method of CMP, scrubbing, and mobile ion removal through plasma etching thus represents a first embodiment of our invention.

Figure 4:
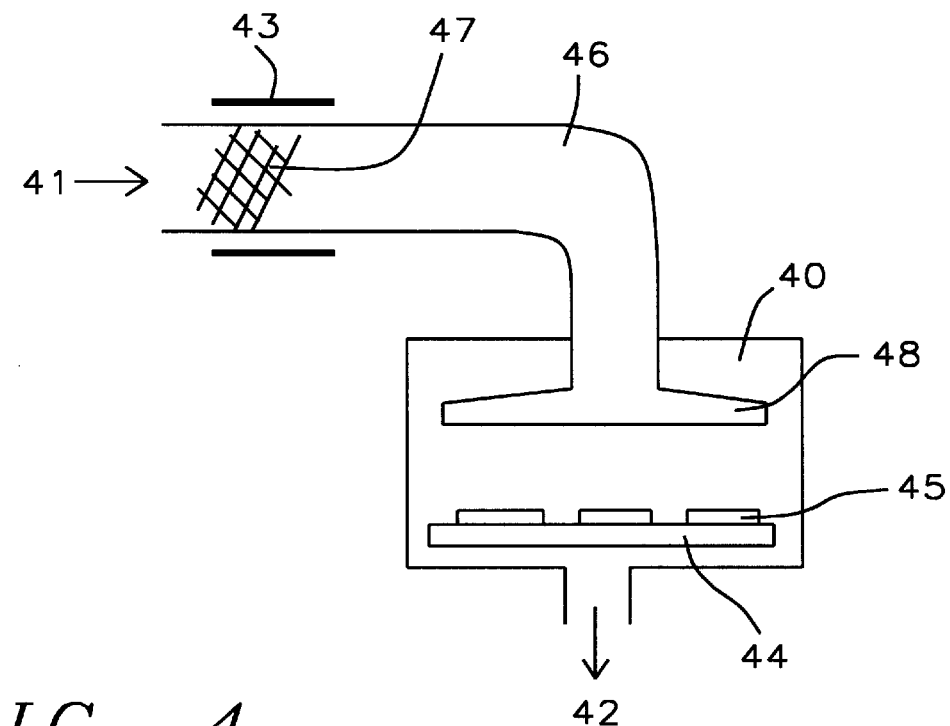
FIG. 4 shows a dowmstream plasma etcher.

In a process that represents a second embodiment of our invention, we have used the plasma etching apparatus shown in FIG. 4. Reactive gas 41 enters lead-in 46 of downstream etcher 40 where it passes through an electrodeless RF discharge 47 (generated by external cylindrical electrode 43) on its way to vacuum sink 42. Substrate holder 44, on which semiconductor wafers 45 rest, is not part of the RF circuit. As gas 41 passes through discharge 47 it becomes dissociated and/or ionized, substantially increasing its reactivity relative to silicon oxide and therefore acting as an effective etchant. Lead-in 46 broadens out into nozzle 48 to ensure full exposure of the wafers to the reactive species. For the reactive gas we have used $CF_4$ but similar gases such as $CHF_3$ or $SF_6$ could also have been used. Typically, the time period for which the wafers were subjected to plasma etching was between about 0.2 and 5 minutes. We have found that removing between about 50 and 500 Angstroms of the polished surface (after scrubbing) in this manner effectively removes the residual mobile ions (see Table I below) without, at the same time, introducing microgrooves or trenches in the polished surface.

Figure 5:
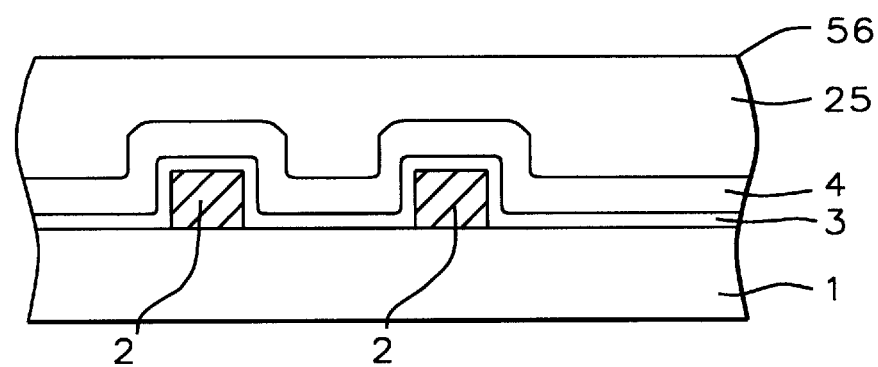
FIG. 5 shows the integrated circuit of FIG. 1 after CMP that has been followed by plasma etching for removal of residual ions.

The effectiveness of the present invention is schematically illustrated in FIG. 5. After CMP, scrubbing, and plasma etching, surface 56 of layer 25 (originally layer 5 prior to CMP) is seen to be microscopically smooth. The almost complete absence of residual mobile ions on surface 56 can be seen in Table I which compares mobile ion concentrations (in units of $10^{10}$ atoms/sq. cm.) on post CMP wafers (average of two wafers, three sampling areas per wafer) for the commercial OnTrak ($NH_4OH$) process, the HF process, and the plasma etch process (this invention):

TABLE I

Surface concentrations of residual ions for three different processes.

| ION TYPE | PROCESSES | | |
| --- | --- | --- | --- |
|  | OnTrak | HF | PLASMA |
| Ca | 600 | <1.8 | <1.8 |
| Cl | 1200 | 50 | 44 |
| Fe | 80 | <0.6 | <0.6 |
| Cu | 10 | <0.5 | <0.6 |
| Zn | 3000 | <0.5 | <0.5 |
| K | 200 | <2.6 | <2.6 |

While the invention has been particularly shown and described with reference to the preferred embodiments thereof, it will be understood by those skilled in the art that various changes in form and details may be made without departing from the spirit and scope of the invention.

What is claimed is:

1. A process for chem.-mech. polishing comprising the steps of:

providing an integrated circuit having an upper layer of PETEOS or BPTEOS oxide that is non-planar;

providing a slurry and an etchant;

using said slurry and etchant, chem.-mech. polishing said upper layer to remove a first thickness of said upper layer;

scrubbing said polished upper layer to remove particle contaminants;

providing a plasma etcher; and removing a second thickness of said upper layer by means of dry etching in a gas plasma in said plasma etcher.

2. The process of claim 1 wherein the slurry comprises aluminum oxide particles.

3. The process of claim 1 wherein the etchant comprises potassium hydroxide or ammonium hydroxide.

4. The process of claim 1 wherein the first thickness of removed upper layer is between about 5,000 and 15,000 Angstroms.

5. The process of claim 1 wherein the second thickness of removed upper layer is between about 50 and 500 Angstroms.

6. The process of claim 1 wherein the gas plasma comprises $CF_4$ or $CHF_3$.

7. The process of claim 1 wherein said plasma etcher comprises a parallel electrode dry etcher.

8. The process of claim 1 wherein said plasma etcher comprises a downstream plasma etcher.

9. The process of claim 1 wherein the scrubbing step is performed in the presence of ammonium hydroxide.

10. A process for manufacturing an integrated circuit comprising the steps of:

providing a silicon substrate;

forming active and passive devices on said substrate;

forming conductive wiring on said substrate;

depositing a passivation layer of PETEOS or BPTEOS oxide, having a surface, over said devices and said wiring;

chem.-mech. polishing said passivation layer until said surface is planar;

scrubbing said polished surface to remove particulate contaminants; and then, for a period of time, dry etching said scrubbed surface.

11. The process of claim 10 wherein said passivation layer is deposited to a thickness that is between about 9,000 and 25,000 Angstroms.

12. The process of claim 10 wherein said period of time is between about 0.2 and 5 minutes.

13. The process of claim 10 wherein the step of dry etching further comprises:

providing a reactive gas;

forming a plasma in said gas by means of RF excitation through an RF circuit; and allowing said plasma to come into contact with said scrubbed surface.

14. The process of claim 13 wherein the silicon substrate is part of the RF circuit.

15. The process of claim 13 wherein the plasma is formed in an area removed from the silicon substrate and then conveyed to it.

* * * * *